(12) United States Patent
Li

(10) Patent No.: US 8,860,491 B1
(45) Date of Patent: Oct. 14, 2014

(54) INTEGRATOR OUTPUT SWING REDUCTION TECHNIQUE FOR SIGMA-DELTA ANALOG-TO-DIGITAL CONVERTERS

(71) Applicant: Jipeng Li, Windham, NH (US)

(72) Inventor: Jipeng Li, Windham, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/937,627

(22) Filed: Jul. 9, 2013

(51) Int. Cl.
*G06F 7/64* (2006.01)

(52) U.S. Cl.
USPC ............ 327/336; 327/339; 327/341; 327/344; 341/143

(58) Field of Classification Search
USPC .................... 327/336, 339, 341, 344; 341/143
See application file for complete search history.

(56) References Cited

U.S. PATENT DOCUMENTS

| | | | | |
|---|---|---|---|---|
| 7,405,687 | B2 * | 7/2008 | Mitteregger et al. | 341/143 |
| 7,688,236 | B2 * | 3/2010 | Di Giandomenico et al. | 341/120 |
| 8,077,066 | B2 * | 12/2011 | Niwa et al. | 341/143 |
| 8,570,201 | B2 * | 10/2013 | Ashburn et al. | 341/143 |
| 8,581,763 | B2 * | 11/2013 | Niwa et al. | 341/143 |
| 8,638,251 | B1 * | 1/2014 | Hong et al. | 341/143 |
| 8,698,664 | B2 * | 4/2014 | Oliaei et al. | 341/155 |

OTHER PUBLICATIONS

Kwon et al., "Op-amp Swing Reduction in Sigma-Delta Modulators", Proceedings of IEEE International Symposium on Circuits and Systems (ISCAS) 2004, vol. 1, pp. 525-528, May 2004.
Pavan et al., "Power Reduction in Continuous-Time Delta-Sigma Modulators Using the Assisted Opamp Technique", IEEE Journal of Solid-State Circuits, vol. 45, No. 7, pp. 1365-1379, Jul. 2010.
Shibata et al., "A DC-to-1 GHz Tunable RF Delta-Sigma ADC Achieving DR=74 dB and BW=150 MHz at f(o)=450 MHz Using 550 mW", IEEE Journal of Solid-State Circuits, vol, 47, No. 12, pp. 2888-2897, Dec. 2012.

* cited by examiner

Primary Examiner — Kenneth B. Wells
(74) Attorney, Agent, or Firm — Kenyon & Kenyon LLP

(57) ABSTRACT

Embodiments of the present invention may include an apparatus and method to reduce an output swing in each stage of a multi-stage loop filter while also maintaining a desired signal transfer function for each respective stage. A given stage of the loop filter may include an integrator, a feedback path, a first cancellation path, and a second cancellation path. The first cancellation path may be coupled to the output of the integrator. The second cancellation path may be coupled to a feedback path provided about the input and output of the integrator. A first cancellation signal may be injected into the first cancellation path to reduce the output swing of the integrator. A second cancellation signal may be injected into the second cancellation path to minimize a change in the integrator's signal transfer function caused by the first cancellation signal.

19 Claims, 3 Drawing Sheets

100

200

300

US 8,860,491 B1

INTEGRATOR OUTPUT SWING REDUCTION TECHNIQUE FOR SIGMA-DELTA ANALOG-TO-DIGITAL CONVERTERS

BACKGROUND

The present invention relates to sigma-delta (ΣΔ) analog-to-digital converters.

In conventional ΣΔ converters, a front-end stage samples an input voltage with charge storage components (i.e., storage capacitors), and the charge is then accumulated on another set of components (i.e., integrating capacitors). The integrated samples are then quantized by an analog-to-digital converter (ADC), for example, a flash ADC. The ADC output is also looped back via a feedback DAC to be subtracted from the input voltage. The feedback DAC samples a reference voltage dependent on the ADC output bit state(s).

A typical ΣΔ ADC includes: a loop filter, integrator(s), an ADC, a feedback DAC, and a subtractor. A ΣΔ ADC receives an analog input signal x[t] over time t and generate an N-valued digital output signal y[n] over discrete times 'n'. Resolution of the output signal y[n] is be determined by the resolution of the ADC.

During operation, the subtractor subtracts from the input signal x[t] a feedback signal, labeled $y_a$[t]. The feedback signal $y_a$[t] is be an analog representation of the output signal y[n] of the DAC. An output signal from the subtractor is be filtered by the loop filter, which may effectively perform at least one integration using integrator(s) on the signal output from the subtractor. An output from the loop filter is be fed to the ADC. The ADC generates the output signal y[n], a digital representation of the input signal x[t]. The integrator(s) is/are a source for errors within a typical ΣΔ ADC. In particular, each integrator within the ΣΔ ADC may have an undesirable output swing that causes increased amplifier distortion.

ΣΔ ADCs have been widely used in digital audio and high precision instrumentation systems. More recently, ΣΔ ADCs are finding new application in infrastructure wide-band radio receivers. In the design of ΣΔ ADCs, it is desirable to have small integrator output swing (for a given integrator gain) so the amplifier distortion is smaller and current consumption is lower. Unfortunately, the integrator output swing is determined by coefficients' scaling and supply voltage headroom. When integrators are scaled for smaller swing, their AC gain is also reduced. This results in lager noise contribution from the following stages. In practical design processes, the scaling can be optimized to achieve the best trade-off among the noise, distortion, and power. However, it is desirable to reduce integrator output swing without compromising with noise performance.

Previous efforts to reduce integrator output swing have undesirable side-effects. For example, some techniques introduce a feedfoward path from the input of a first stage integrator in a loop filter to input of the following stage integrator to partially cancel the current generated by the feedback DAC coupled to the same node. The output swing of the front integrator is forced to be smaller by the loop because the net input of the following stage should be close to zero. However, one unobvious byproduct of the feed-forward technique is that the added feedfoward path will change the integrator's signal transfer function (SFT) because of the extra signal path. This effect is usually more severe for out-of-band response and sometimes results in large peaking. Thus, the foregoing design technique is not suitable for designs with stringent STF requirements.

DETAILED DESCRIPTION

Embodiments of the present invention may include an apparatus and method to reduce an output swing in each stage of a multi-stage loop filter while also maintaining a desired signal transfer function for each respective stage. A given stage of the loop filter may include a an integrator, a feedback path, a first cancellation path, and a second cancellation path. The first cancellation path may be coupled to the output of the integrator. The second cancellation path may be coupled to a feedback path provided about the input and output of the integrator. A first cancellation signal may be injected into the first cancellation path to reduce the output swing of the integrator. A second cancellation signal may be injected into the second cancellation path to minimize a change in the integrator's signal transfer function caused by the first cancellation signal. In this manner, the output swing of the integrator may be reduced without significantly affecting the signal transfer function of the integrator.

Figure 1:
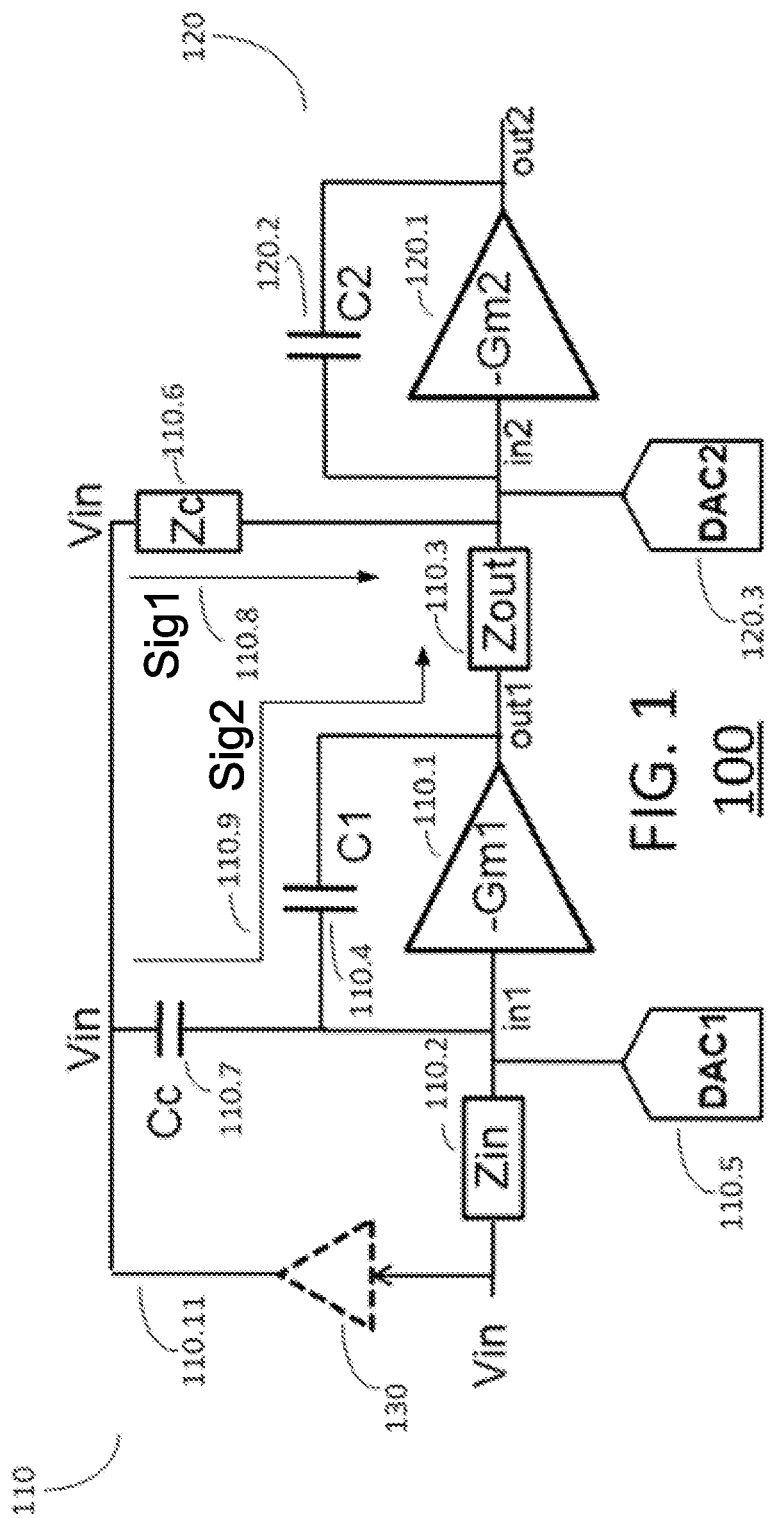
FIG. 1 is a circuit diagram of the first two stages of a multi-stage loop filter of a ΣΔ ADC according to an embodiment of the present invention.

FIG. 1 is a circuit diagram of the first two stages of a multi-stage loop filter 100 of a ΣΔ ADC according to an embodiment of the present invention. The loop filter 100 may receive an input signal Vin, integrate the signal Vin, and output the integrated Vin signal into an ADC. The first stage (or first integrator) 110 of the loop filter 100 may include a transconductance amplifier Gm1 110.1, an input impedance Zin 110.2, an output impedance Zout 110.3, a feedback capacitor C1 110.4, a feedback DAC1 110.5, a cancellation impedance Zc 110.6 provided on a first feed-forward cancellation path 110.8, and a cancellation capacitor Cc 110.7 provided on a second feed-forward cancellation path 110.9. The second stage (or second integrator) 120 may include a transconductance amplifier 120.1, a feedback capacitor C2 120.2, and a feedback DAC2 120.3.

The input impedance Zin 110.2 and the feedback DAC1 110.5 may be coupled to the input of the transconductance amplifier Gm1 110.1 and the output impedance Zout 110.3 may be coupled between the output of the transconductance amplifier Gm1 110.1 and the input of the transconductance amplifier Gm2 120.1. The feedback DAC2 120.3 may be coupled to the input of the transconductance amplifier Gm2 120.1. The feedback capacitors C1 110.4 and C2 120.2 may be provided in feedback about the respective transconductance amplifiers Gm1 110.1 and Gm2 120.1. The first cancellation path 110.8 may include the cancellation impedance Zc and may be coupled to the input, Vin, of the loop filter 100, on one end and the input of the transconductance amplifier 120.1 on the other end. The second cancellation path 110.9 may include the cancellation capacitor Cc 110.7 and may be coupled to the feedback path of the transconductance amplifier Gm1 110.1 on one end and the input, Vin, of the loop filter 100 on the other end.

The input signal Vin may be coupled to the second cancellation path 110.9 and the first cancellation path 110.8 via the feed-forward path 110.11. The second cancellation path 110.9 may invert the input signal Vin while the first cancellation path 110.8 may be non-inverting. In this manner, a first feed-forward signal Sig1 may be output from the first cancellation path 110.8 and a second feed-forward signal Sig2 (which may be equal in magnitude and opposite in polarity to the first feed-forward Sig1) may be output from the second cancellation path 110.9.

During operation the first feed-forward signal Sig1 may be injected into the first cancellation path 110.8 through the cancellation impedance Zc 110.6 to node in2 (i.e., the input of the second stage 120). The cancellation impedance Zc may balance the DAC2 120.3 current. Consequently, the voltage swing at the node out1 (i.e., the output of the transconductance amplifier Gm1 110.1) may be reduced. Although the first cancellation path 110.8 through the cancellation impedance Zc 110.6 may not affect the noise transfer function (NTF) of the first stage 110, the signal transfer function (STF) may be affected because the input signal Vin is now going through multiple paths in the loop filter 100.

The second feed-forward (or cancellation) signal Sig2 may be injected into the second cancellation path 110.9 through the cancellation capacitor Cc 110.7, the feedback capacitor C1 110.4, and the output impedance Zout 110.3. The first feed-forward (or cancellation) signal Sig1 (through Zc 110.6) may be equal in magnitude and opposite in polarity to the second feed-forward signal Sig2 (through the cancellation capacitor Cc 110.7, the feedback capacitor 110.4, and the output impedance Zout 110.3). The feed-forward signals Sig1 and Sig2 may be cancelled if the values of Cc, C1, Zout, and Zc are set in accordance with the following equation:

$$Zc=Zout*C1/Cc \qquad \text{Eq. (1)}.$$

As a result, the net current flowing into the second stage 120 (at node in2) due to the two cancellation paths 110.8 and 110.9 may be substantially reduced. Thus, the SFT of the loop filter 100 may remain substantially unchanged because the ADC (at the output of the loop filter 100) may not see the two injected signals at all.

The first stage 110 of the loop filter 100 may include a buffer 130 (shown as an option, in dashed lines). The buffer 130 may be coupled between the input voltage signal Vin and the cancellation capacitor Cc 110.7. The buffer 130 may reduce the load to the front end of the CTSD ADC into which the loop filter 100 is integrated. The in-band noise and distortion contribution from the buffer 130 may be cancelled in a similar fashion as the injected signal Vin. A delay may also be added to the buffer 130 to match the STF delay to optimize the first stage's 110 output swing reduction.

Figure 2:
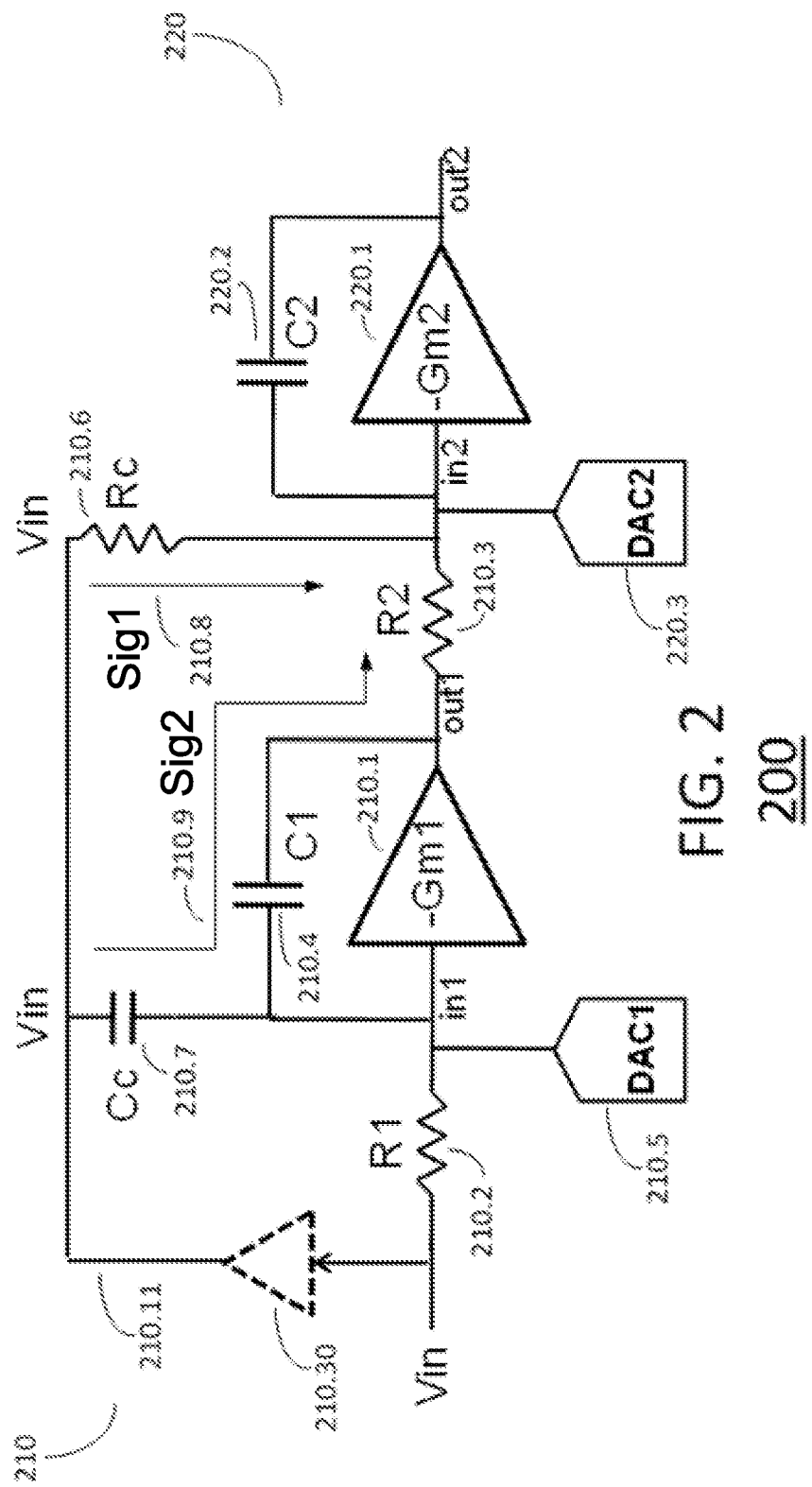
FIG. 2 is a circuit diagram of the first two stages of a multi-stage loop filter of a continuous time ΣΔ ADC according to an embodiment of the present invention.
Figure 3:
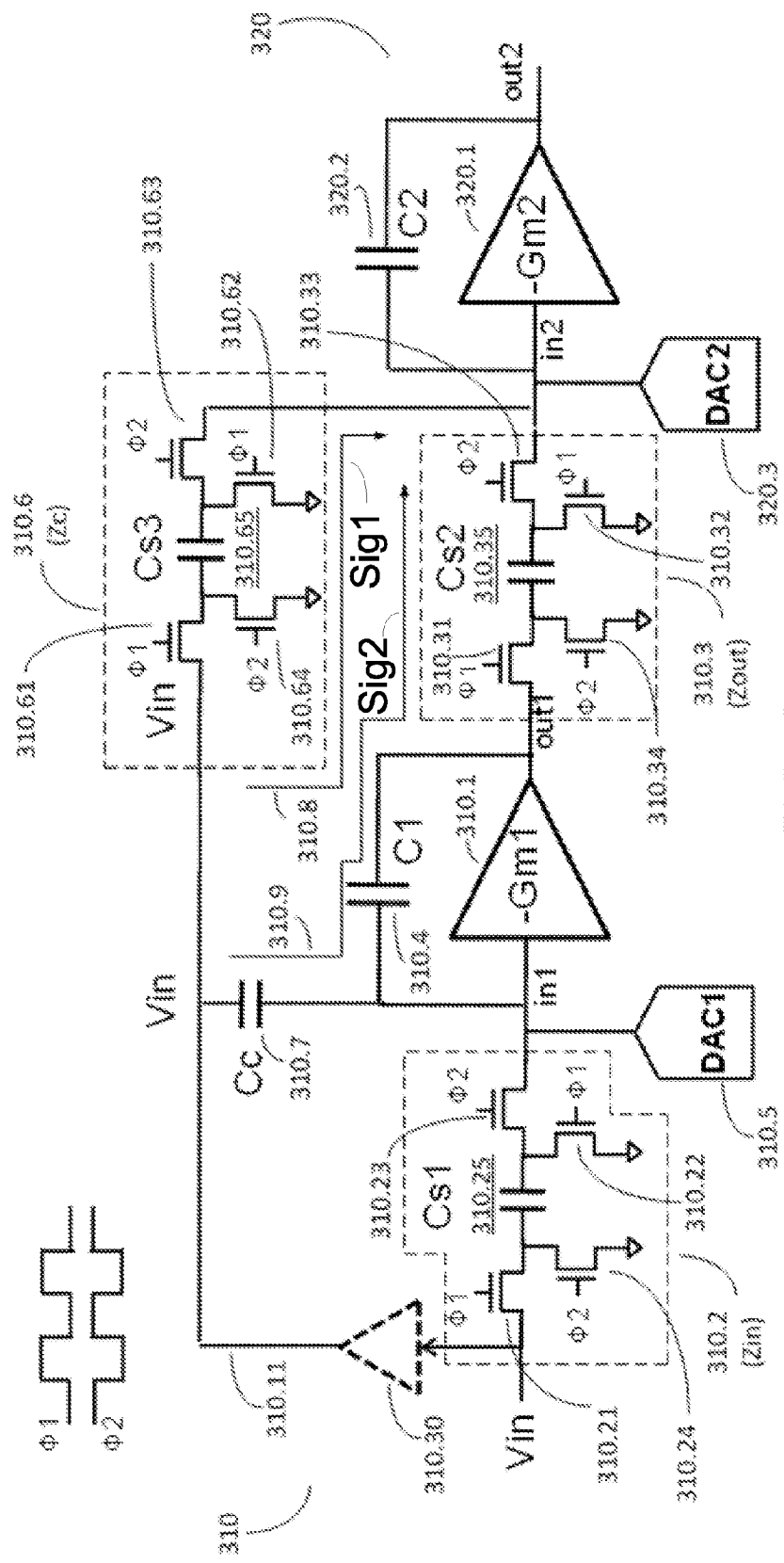
FIG. 3 is a circuit diagram of the first two stages of a multi-stage loop filter of a switched-capacitor ΣΔ ADC according to an embodiment of the present invention.

Although the embodiment described above with respect to FIG. 1 may reduce output swing of the first integrator 110 of the multi-stage loop filter 100 using the two cancellation paths 110.8 and 110.9, the same techniques may be extended to the second integrator 120, as well as the remaining stages (not shown) of the multi-stage loop filter 100. Moreover, the techniques described above may also apply to specific types of $\Sigma\Delta$ ADCs, such as continuous time $\Sigma\Delta$ ADCs ("CTSD ADCs") or switched capacitor $\Sigma\Delta$ ADCs. FIGS. 2 and 3 are circuit diagrams of exemplary circuit configurations of embodiments of the present application.

FIG. 2 is circuit diagram of the first two stages in a multi-stage loop filter 200 of a CTSD ADC according to an embodiment of the present invention. The loop filter 200 may receive an input signal Vin, integrate the signal Vin, and output the integrated Vin signal into an ADC. The first stage (or first integrator) 210 of the loop filter 200 may include a transconductance amplifier Gm1 210.1, an input resistor R1 210.2, an output resistor R2 210.3, a feedback capacitor C1 210.4, a feedback DAC1 210.5, a cancellation resistor Rc 210.6 provided on a first feed-forward cancellation path 210.8, and a cancellation capacitor Cc 210.7 provided on a second feed-forward cancellation path 210.9. The second stage (or second integrator) 220 may include a transconductance amplifier 220.1, a feedback capacitor C2 220.2, and a feedback DAC2 220.3.

The input resistor R1 210.2 and the feedback DAC1 210.5 may be coupled to the input of the transconductance amplifier Gm1 210.1 and the output resistor R2 210.3 may be coupled between the output of the transconductance amplifier Gm1 210.1 and the input of the transconductance amplifier Gm2 220.1. The feedback DAC2 220.3 may be coupled to the input of the transconductance amplifier Gm2 220.1. The feedback capacitors C1 210.4 and C2 220.2 may be provided in feedback about respective transconductance amplifiers Gm1 210.1 and Gm2 220.1. The first cancellation path 210.8 may include the cancellation resistor Rc and may be coupled to the input, Vin, of the loop filter 200 on one end and the input of the transconductance amplifier 220.1 on the other end. The second cancellation path 210.9 may include the cancellation capacitor Cc 210.7 and may be coupled to the feedback path of the transconductance amplifier Gm1 210.1 on one end and the input, Vin, of the loop filter 200 on the other end.

The input signal Vin may be coupled to the second cancellation path 210.9 and the first cancellation path 210.8 via the feed-forward path 210.11. The second cancellation path 110.9 may invert the input signal Vin while the first cancellation path 210.8 may be non-inverting. In this manner, a first feed-forward signal Sig1 may be output from the first cancellation path 210.8 and a second feed-forward signal Sig2 (which may be equal in magnitude and opposite in polarity to the first feed-forward) may be output from the second cancellation path 210.9.

During operation the first feed-forward signal Sig1 may be injected into the first cancellation path 210.8 through the cancellation resistor Rc 210.6 to node in2 (i.e., the input of the second stage 220). The cancellation resistor Rc 210.6 may balance the DAC2 220.3 current. Consequently, the voltage swing at the node out1 (i.e., the output of the transconductance amplifier Gm1 210.1) may be reduced. Although the feed-forward cancellation path 210.8 through the cancellation resistor Rc 210.6 may not affect the noise transfer function (NTF) of the first stage 210, the signal transfer function (STF) may be affected because the input signal Vin is now going through multiple paths in the loop filter 200.

The second feed-forward signal Sig2 may be injected into the second cancellation path 210.9 through the cancellation capacitor Cc 210.4, the feedback capacitor C1 210.4, and the output resistor R2 210.3. The second feed-forward signal Sig2 (through Rc 210.6) may be equal in magnitude and opposite in polarity to the first feed-forward signal Sig1 (through the cancellation capacitor Cc 210.7, the feedback capacitor 210.4, and the output resistor R2 210.3). The feed-forward signals Sig1 and Sig2 may be cancelled if the values of Cc, C1, R2, and Rc are in accordance with following equation:

$$Rc=R2*C1/Cc \qquad \text{Eq. (2)}.$$

As a result, the net current flowing into the second stage 220 (at node in2) due to the two cancellation paths 210.8 and 210.9 may be substantially reduced. Thus, the SFT of the loop filter 200 may remain substantially unchanged because the ADC does not see the two injected signals at all.

The first stage 210 of the loop filter 200 may include a buffer 230 (shown as an option, in dashed lines). The buffer 230 may be coupled between the input voltage signal Vin and the cancellation capacitor Cc 210.7. The buffer 230 may reduce the load to the front end of the CTSD ADC into which the loop filter 200 may be integrated. The in-band noise and distortion contribution from the buffer 230 may be cancelled in a similar fashion as the injected signal Vin. A delay may also be added to the buffer 230 to match the STF delay to optimize the first stage's 210 output swing reduction.

Although the embodiment described above with respect to FIG. 2 may reduce output swing of the first integrator 210 of the multi-stage loop filter 200 using the two cancellation paths 210.8 and 210.9, the same techniques may be extended to the second integrator 220, as well as the remaining stages (not shown) of the multi-stage loop filter 200.

FIG. 3 is circuit diagram of the first two stages in a multi-stage loop filter 300 of a switched capacitor ΣΔ ADC according to an embodiment of the present invention. The loop filter 300 may receive an input signal Vin, integrate the signal Vin, and output the integrated Vin signal into an ADC. The first stage (or first integrator) 310 of the loop filter 300 may include a transconductance amplifier Gm1 310.1, an input switched capacitor circuit 310.2, an output switched capacitor circuit 310.3, a feedback capacitor C1 310.4, a feedback DAC1 310.5, a cancellation switched capacitor circuit 310.6 provided on a first feed-forward cancellation path 310.8, and a cancellation capacitor Cc 310.7 provided on a second feed-forward cancellation path 310.9. The second stage (or second integrator) 310 may include a transconductance amplifier 320.1, a feedback capacitor C2 320.2, and a feedback DAC2 320.3.

The input switched capacitor circuit 310.2 and the feedback DAC1 310.5 may be coupled to the input of the transconductance amplifier Gm1 310.1 and the output switched capacitor circuit 310.3 may be coupled between the output of the transconductance amplifier Gm1 310.1 and the input of the transconductance amplifier Gm2 320.1. The feedback DAC2 320.3 may be coupled to the input of the transconductance amplifier Gm2 320.1. The feedback capacitors C1 310.4 and C2 320.2 may be provided in feedback about respective transconductance amplifiers Gm1 310.1 and Gm2 320.1. The first cancellation path 310.8 may include the cancellation switched capacitor circuit 310.6 and may be coupled to the input, Vin, of the loop filter 300 on one end and the input of the transconductance amplifier 320.1 on the other end. The second cancellation path 310.9 may include the cancellation capacitor Cc 310.7 and may be coupled to the feedback path of the transconductance amplifier Gm1 310.1 on one end and the input, Vin, of the loop filter 300 on the other end.

The input signal Vin may be coupled to the second cancellation path 310.9 and the first cancellation path 310.8 via the feed-forward path 310.11. The second cancellation path 310.9 may invert the input signal Vin while the first cancellation path 310.8 may be non-inverting. In this manner, a first feed-forward signal Sig1 may be output from the first cancellation path 310.8 and a second feed-forward signal Sig2 (which may be equal in magnitude and opposite in polarity to the first feed-forward) may be output from the second cancellation path 310.9.

The input switched capacitor circuit 310.2 circuit may include a capacitor Cs1 310.25 and a set of four transistors (or switches) 310.21-310.24. A first terminal of the transistor 310.21 may be coupled to the input signal Vin, a second terminal of the transistor 310.21 may be coupled to a first terminal of the capacitor Cs1 310.25, and a third terminal of the transistor 310.21 may be coupled to a first control signal φ1. A first terminal of the transistor 310.22 may be coupled to a second terminal of the capacitor Cs1 310.25, a second terminal of the transistor 310.22 may be coupled to ground, and a third terminal of the transistor 310.22 may be coupled to the first control signal φ1. A first terminal of the transistor 310.23 may be coupled to the second terminal of the capacitor Cs1 310.25, a second terminal of the transistor 310.23 may be coupled to the input of the transconductance amplifier Gm1 310.1, and a third terminal of the transistor 310.23 may be coupled to a second control signal φ2. A first terminal of the transistor 310.24 may be coupled to the first terminal of the capacitor Cs1 310.25, a second terminal of the transistor 310.24 may be coupled to ground, and a third terminal of the transistor 310.24 may be coupled to the second control signal φ2. The input switched capacitor circuit 310.3 may have an impedance of Zin, which may be based on the value of the capacitor Cs1 310.25 and the properties of the transistors 310.21-310.24. The transistors 310.21-310.24 may be metal-oxide-semiconductor field-effect transistors (MOSFETs) or other suitable types of transistors which may find application in switched capacitor circuits.

The transistors 310.21 and 310.22 may be controlled by the first control signal φ1 and the transistors 310.23 and 310.24 may be controlled by the second control signal φ2. The signals may be out-of-phase with respect to each other (as shown in FIG. 3). Thus for a given clock-cycle, when one signal has a high value, the other signal may have a low value. During operation, when the signal φ1 is high and the signal φ2 is low (i.e., transistors 310.21 and 310.22 are on and transistors 310.23 and 310.24 are off), Vin may be stored on the capacitor Cs1 310.25. On the next clock cycle, the signal φ2 may be high and the signal φ1 may be low (i.e., transistors 310.23 and 310.24 are on and transistors 310.21 and 310.22 are off). In this manner, the voltage Vin stored on capacitor Cs1 310.25 may be transferred to the input of the transconductance amplifier Gm1 310.1 (at node in1).

The output switched capacitor circuit 310.3 circuit may include a capacitor Cs2 310.35 and a set of four transistors (or switches) 310.31-310.34. A first terminal of the transistor 310.31 may be coupled to the output of the transconductance amplifier Gm1 310.1, a second terminal of the transistor 310.31 may be coupled to a first terminal of the capacitor Cs2 310.35, and a third terminal of the transistor 310.31 may be coupled to the first control signal φ1. A first terminal of the transistor 310.32 may be coupled to a second terminal of the capacitor Cs2 310.35, a second terminal of the transistor 310.32 may be coupled to ground, and a third terminal of the transistor 310.32 may be coupled to the first control signal φ1. A first terminal of the transistor 310.33 may be coupled to the second terminal of the capacitor Cs2 310.35, a second terminal of the transistor 310.33 may be coupled to the input of the transconductance amplifier Gm2 320.1, and a third terminal of the transistor 310.33 may be coupled to a second control signal φ2. A first terminal of the transistor 310.34 may be coupled to the first terminal of the capacitor Cs2 310.35, a second terminal of the transistor 310.34 may be coupled to ground, and a third terminal of the transistor 310.34 may be coupled to the second control signal φ2. The output switched capacitor circuit 310.3 may have an impedance of Zout, which may be based on the value of the capacitor Cs2 310.35 and the properties of the transistors 310.31-310.34. The transistors 310.31-310.34 may be metal-oxide-semiconductor field-effect transistors (MOSFETs) or other suitable types of transistors which may find application in switched capacitor circuits.

The transistors 310.31 and 310.32 may be controlled by the first control signal φ1 and the transistors 310.33 and 310.34 may be controlled by the second control signal φ2. The signals may be out-of-phase with respect to each other (as shown in FIG. 3). Thus for a given clock-cycle, when one signal has a high value, the other signal may have a low value. During operation, when the signal φ1 is high and the signal φ2 is low (i.e., transistors 310.31 and 310.32 are on and transistors 310.33 and 310.34 are off), the output signal of the transconductance amplifier Gm1 310.1 may be stored on the capacitor Cs2 310.35. On the next clock cycle, the signal φ2 may be high and the signal φ1 may be low (i.e., transistors 310.33 and 310.34 are on and transistors 310.21 and 310.22 are off). In this manner, the output signal stored on the capacitor Cs2 310.35 may be transferred to the input of the transconductance amplifier Gm2 320.1 (at node in2).

The cancellation switched capacitor circuit 310.6 circuit may include a capacitor Cs3 310.65 and a set of four transistors (or switches) 310.61-310.64. A first terminal of the transistor 310.61 may be coupled to the input signal Vin, a second terminal of the transistor 310.61 may be coupled to a first terminal of the capacitor Cs3 310.65, and a third terminal of the transistor 310.61 may be coupled to the first control signal φ1. A first terminal of the transistor 310.62 may be coupled to a second terminal of the capacitor Cs3 310.65, a second terminal of the transistor 310.62 may be coupled to ground, and a third terminal of the transistor 310.62 may be coupled to the first control signal φ1. A first terminal of the transistor 310.63 may be coupled to the second terminal of the capacitor Cs3 310.65, a second terminal of the transistor 310.63 may be coupled to the input of the transconductance amplifier Gm2 320.1, and a third terminal of the transistor 310.63 may be coupled to a second control signal φ2. A first terminal of the transistor 310.64 may be coupled to the first terminal of the capacitor Cs3 310.65, a second terminal of the transistor 310.64 may be coupled to ground, and a third terminal of the transistor 310.64 may be coupled to the second control signal φ2. The cancellation switched capacitor circuit 310.6 may have an impedance of Zc, which may be based on the value of the capacitor Cs3 310.65 and the properties of the transistors 310.61-310.64. The transistors 310.61-310.64 may be metal-oxide-semiconductor field-effect transistors (MOSFETs) or other suitable types of transistors which may find application in switched capacitor circuits.

The transistors 310.61 and 310.62 may be controlled by the first control signal φ1 and the transistors 310.63 and 310.64 may be controlled by the second control signal φ2. The signals may be out-of-phase with respect to each other (as shown in FIG. 3). Thus for a given clock-cycle, when one signal has a high value, the other signal may have a low value. During operation, when the signal φ1 is high and the signal φ2 is low (i.e., transistors 310.61 and 310.62 are on and transistors 310.63 and 310.64 are off), the first cancellation signal −Vin may be stored in the capacitor Cs3 310.65. On the next clock cycle, the signal φ2 may be high and the signal φ1 may be low (i.e., transistors 310.63 and 310.64 are on and transistors 310.61 and 360.22 are off). In this manner, the voltage −Vin stored on capacitor Cs3 310.65 may be transferred to the input of the transconductance amplifier Gm2 320.1 (at node in2).

During operation the first feed-forward signal Sig1 may be injected into the first cancellation path 310.8 through the cancellation switched capacitor circuit 310.6 to node in2 (i.e., the input of the second stage 320). The impedance Zc of the switched capacitor circuit 310.6 may balance the DAC2 320.3 current. Consequently, the voltage swing at the node out1 (i.e., the output of the transconductance amplifier Gm1 310.1) may be reduced. Although the feed-forward cancellation path 310.8 through the cancellation switched capacitor circuit 310.6 may not affect the noise transfer function (NTF) of the first stage 310, the signal transfer function (STF) may be affected because the input signal Vin is now going through multiple paths in the loop filter 300.

A second feed-forward signal Sig2 may be injected into the second cancellation path 310.9 through the cancellation capacitor Cc 310.7, the feedback capacitor C1 310.4, and the output switched capacitor circuit 310.3 (or Zout). The second feed-forward signal Sig2 (through the cancellation capacitor Cc 310.7, the feedback capacitor 310.4, and the output switched capacitor circuit 310.3) may be equal in magnitude and opposite in polarity to the first feed-forward signal Sig1 (through the cancellation switched capacitor circuit 310.6). The feed-forward signals Sig1 and Sig2 may be cancelled if the values of Cc, C1, Cs2, and Cs3 are set in accordance with following equation.

$$Cs2 = Cs3 * C1/Cc \qquad \text{Eq. (3).}$$

As a result, the net current flowing into the second stage 320 (at node in2) due to the two cancellation paths 310.8 and 310.9 may be substantially reduced. Thus, the SFT of the loop filter 300 may remain substantially unchanged because the ADC (at the output of the loop filter 300) may not see the two injected signals at all.

The first stage 310 of the loop filter 300 may include a buffer 330 (shown as an option, in dashed lines). The buffer 330 may be coupled between the input voltage signal Vin and the cancellation capacitor Cc 310.7. The buffer 330 may reduce the load to the front end of the CTSD ADC into which the loop filter 300 may be integrated. The in-band noise and distortion contribution from the buffer 330 may be cancelled in a similar fashion as the injected signal Vin. A delay may also be added to the buffer to match the STF delay to optimize the first stage's 310 output swing reduction.

Although the embodiment described above with respect to FIG. 3 may reduce output swing of the first integrator 310 of the multi-stage loop filter 300 using the two cancellation paths 310.8 and 310.9, the same techniques may be extended to the second integrator 320, as well as the remaining stages (not shown) of the multi-stage loop filter 300.

Although the foregoing techniques have been described above with reference to specific embodiments, the invention is not limited to the above embodiments and the specific configurations shown in the drawings. For example, some components shown may be combined with each other as one embodiment, or a component may be divided into several subcomponents, or any other known or available component may be added. Those skilled in the art will appreciate that these techniques may be implemented in other ways without departing from the spirit and substantive features of the invention. The present embodiments are therefore to be considered in all respects as illustrative and not restrictive.

I claim:

1. An integrated circuit, comprising:
    a first and second integrator provided in cascade, the first integrator having an input terminal for receiving an input signal and a feedback path comprising a feedback impedance between an output terminal of the integrator and the input terminal of the integrator;
    a digital to analog converter coupled to an input terminal of the second integrator;
    an output impedance provided in an output path from the output terminal of the first integrator to the input terminal of the second integrator;
    a first cancellation impedance coupled to the input terminal of the second integrator and driven by a first cancellation signal, wherein the first cancellation impedance is of the same type as the output impedance; and
    a second cancellation impedance coupled to the feedback path of the first integrator and driven by a second cancellation signal, wherein the second cancellation impedance is of the same type as the feedback impedance.

2. The integrated circuit of claim 1, wherein:
the first cancellation signal is injected into the first cancellation impedance towards the input terminal of the second integrator to reduce an output swing of the first integrator; and
the second cancellation signal is injected into the second cancellation impedance towards the feedback path of the first integrator to minimize a change in a signal transfer function of the first integrator caused by the first cancellation signal.

3. The integrated circuit of claim 1, wherein the output impedance comprises a first resistor, the first cancellation impedance comprises a second resistor, the feedback impedance comprises a first capacitor, and the second cancellation impedance comprises a second capacitor.

4. The integrated circuit of claim 1, wherein the output impedance comprises a first switched capacitor circuit, the first cancellation impedance comprises a second switched capacitor circuit, the feedback impedance comprises a first capacitor, and the second cancellation impedance comprises a second capacitor.

5. The integrated circuit of claim 1, wherein the first and second cancellation signals are fed-forward from the input terminal of the first integrator.

6. The integrated circuit of claim 1, further comprising a buffer coupled to the second cancellation impedance.

7. A method, for use with a pair of integrators in a cascade configuration in a loop filter, wherein an output impedance is coupled between an output of first integrator and an input of the second integrator, comprising:
injecting a first cancellation signal into a first cancellation path coupled to the input of the second integrator, the first cancellation path comprising a first impedance that is of the same type as the output impedance; and
injecting a second cancellation signal into a second cancellation path coupled to a feedback path of the first integrator, the second cancellation path comprising a second impedance that is of the same type as a feedback impedance of the feedback path.

8. The method of claim 7, wherein the first impedance comprises a resistor and the second impedance comprises a capacitor.

9. The method of claim 7, wherein the first impedance comprises a switched capacitor circuit and the second impedance comprises a capacitor.

10. The method of claim 7, wherein the first and second cancellation signals are fed-forward from an input of the first integrator.

11. The method of claim 7, wherein the first cancellation signal reduces an output swing of the first integrator.

12. The method of claim 11, wherein the second cancellation signal minimizes a change in a signal transfer function of the first integrator caused by the first cancellation signal.

13. The method of claim 7, further comprising injecting the first input signal into a buffer coupled to the first cancellation path.

14. A multi-stage loop filter comprising:
a plurality of integrators connected in a cascade configuration, each integrator comprising:
an input terminal for receiving an input signal and a feedback path comprising a feedback impedance between an output terminal of the integrator and the input terminal of the integrator;
an output impedance provided in an output path from the output terminal of the integrator to an input terminal of a subsequent integrator;
a digital to analog converter coupled to the input terminal of the subsequent integrator;
a first cancellation impedance coupled to the input terminal of the subsequent integrator and driven by a first cancellation signal, wherein the first cancellation impedance is of the same type as the output impedance; and
a second cancellation impedance coupled to the feedback path of the first integrator and driven by a second cancellation signal, wherein the second cancellation impedance is of the same type as the feedback impedance.

15. The loop filter of claim 14, wherein:
the first cancellation signal is injected into the first cancellation impedance towards the input terminal of the following integrator to reduce an output swing of the integrator; and
the second cancellation signal is injected into the second cancellation impedance towards the feedback path of the first integrator to minimize a change in a signal transfer function of the integrator caused by the first cancellation signal.

16. The loop filter of claim 14, wherein the output impedance comprises a first resistor, the first cancellation impedance comprises a second resistor, the feedback path comprises a first capacitor, and the second cancellation impedance comprises a second capacitor.

17. The loop filter of claim 14, wherein the output impedance comprises a first switched capacitor circuit, the first cancellation impedance comprises a second switched capacitor circuit, the feedback path comprises a first capacitor, and the second cancellation impedance comprises a second capacitor.

18. The loop filter of claim 14, wherein the first and second cancellation signals are fed-forward from the input terminal of the integrator.

19. The loop filter of claim 14, further comprising a buffer coupled to the second cancellation impedance.

* * * * *